United States Patent
Arai

[19]

[11] Patent Number: 5,962,891
[45] Date of Patent: Oct. 5, 1999

[54] NONVOLATILE SEMICONDUCTOR MEMORY DEVICE

[75] Inventor: Norihisa Arai, Omiya, Japan

[73] Assignee: Kabushiki Kaisha Tosbhia, Kawasaki, Japan

[21] Appl. No.: 08/725,231

[22] Filed: Oct. 3, 1996

[30] Foreign Application Priority Data

Oct. 3, 1995 [JP] Japan ..................................... 7-256304

[51] Int. Cl.⁶ ............................................... H01L 29/792
[52] U.S. Cl. .......................... 257/324; 257/317; 257/321
[58] Field of Search ..................................... 257/324, 406, 257/317, 321, 296, 390, 408, 905

[56] References Cited

U.S. PATENT DOCUMENTS

| | | |
|---|---|---|
| 4,500,899 | 2/1985 | Shirai et al. . |
| 5,019,527 | 5/1991 | Ohshima et al. . |
| 5,282,160 | 1/1994 | Yamagata ................................ 257/324 |
| 5,304,829 | 4/1994 | Mori et al. ............................. 257/324 |
| 5,337,274 | 8/1994 | Ohji ....................................... 257/315 |
| 5,394,001 | 2/1995 | Yamaguchi et al. .................... 257/315 |
| 5,446,298 | 8/1995 | Kojima .................................. 257/314 |
| 5,572,480 | 11/1996 | Ikeda et al. ............................ 257/324 |
| 5,585,656 | 12/1996 | Hsue et al. ............................. 257/321 |

FOREIGN PATENT DOCUMENTS

| | | | |
|---|---|---|---|
| 404326761 | 11/1992 | Japan ..................................... 257/324 |
| H6-82841 | 10/1994 | Japan . |

OTHER PUBLICATIONS

Science Forum, "Flash Memory Technical Handbook", Aug. 15, 1993, pp. 55–57, Tokyo, Japan.

*Primary Examiner*—Valencia Martin-Wallace
*Assistant Examiner*—George C. Eckert, II
*Attorney, Agent, or Firm*—Banner & Witcoff, Ltd.

[57] ABSTRACT

The semiconductor device having a multilayer gate type transistor constituting memory, comprises a P-type semiconductor substrate, a source formed by diffusing an N-type impurity on a surface of the semiconductor substrate to a first depth, an N-type drain, electrically separated from the source and formed on a surface of the semiconductor substrate, a first insulating film formed on a surface of a channel region between the source and the drain, a first gate electrode formed on a surface of the first insulating film, a second insulating film formed on a surface of the first gate electrode, and a second gate electrode on the second insulating film. The semiconductor device further comprises a source wiring region, which is connected to the source of the multilayer gate transistor and formed by diffusing the N-type impurity in the semiconductor substrate to a second depth shallower than the first depth.

13 Claims, 8 Drawing Sheets

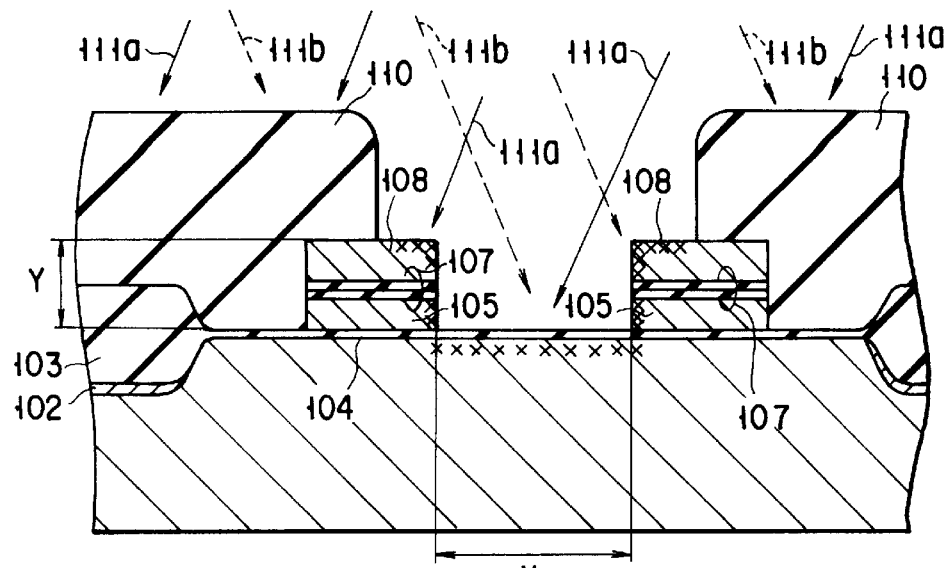
F I G. 10A
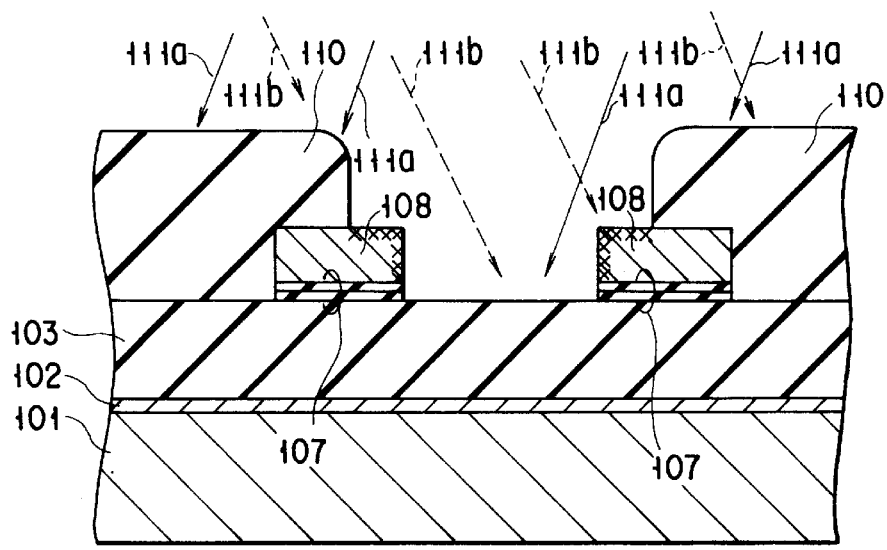
F I G. 10B
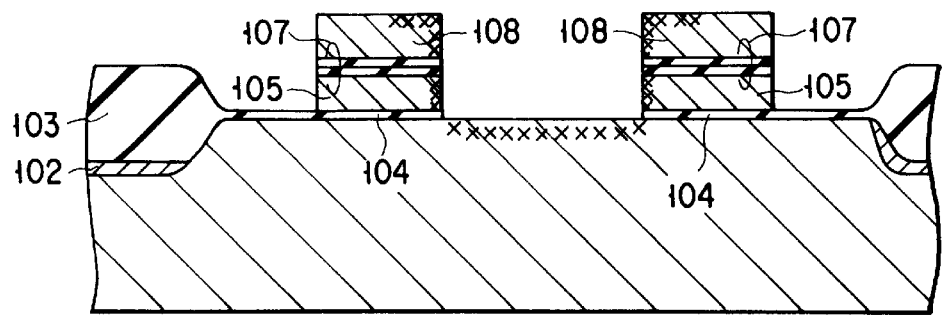
F I G. 11A

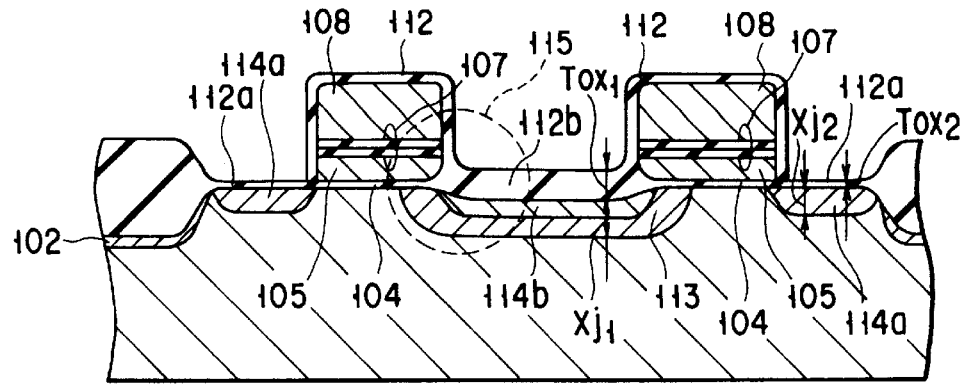
F I G. 13A
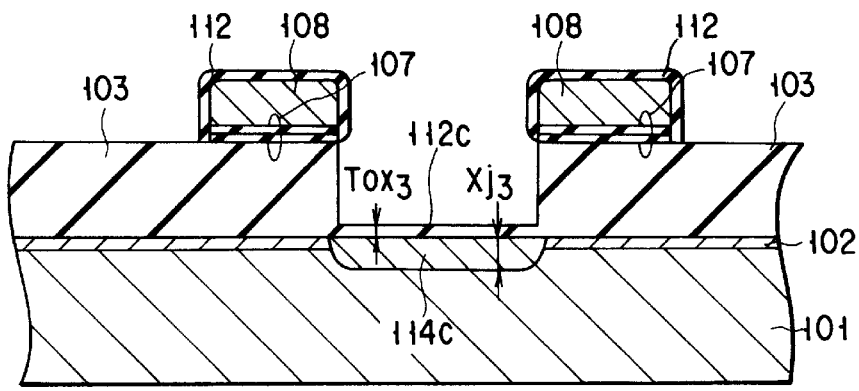
F I G. 13B
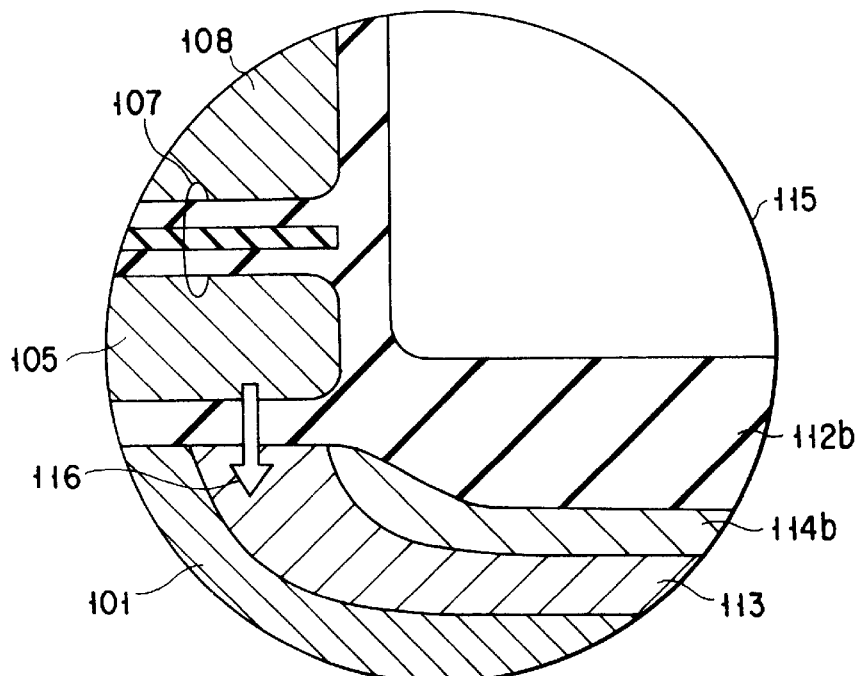
F I G. 14

NONVOLATILE SEMICONDUCTOR MEMORY DEVICE

BACKGROUND OF THE INVENTION

1. Field of the Invention

The present invention relates to a semiconductor device and a method of manufacturing the same. More particularly, the invention relates to an improvement of a nonvolatile memory using a multilayer type transistor as memory cells.

2. Description of the Related Art

Demands for large-capacity semiconductor memories and high-speed semiconductor devices have been increasing in recent years. A semiconductor device using a nonvolatile memory, EEPROM, which uses an insulating film sandwiched between a floating gate electrode and a control gate electrode as a capacitance for data storage, is not an exception.

Representative types of EEPROMs are a channel erase type and a source erase type. In the channel erase type, data is erased by an F-N (Fowler-Nordheim) current flowing between a gate electrode and an entire channel region formed between a source and a drain. In the source erase type, data is erased by the F-N current flowing between a source diffusion layer and a gate electrode edge on the side of the source diffusion layer. To satisfy the demands for the large memory capacity and the high-speed operation simultaneously, generally used is the source erase type, since data can be erased at a lower voltage.

Hereinbelow, we will describe a nonvolatile memory of the prior art which employs multilayer gate transistors as a memory cell, by taking a flash EEPROM of the source-erase type as an example and referring to accompanying drawings.

To ensure the reliability of memory cells of a conventionally employed source-erase type flash EEPROM, a double diffusion layer made of phosphorus and arsenic is sometimes employed for the purpose of forming a deep source diffusion layer, as is described in Jpn. Pat. Appln. KOKOKU Publication No. 6-082841.

The phosphorus deeply diffused in the source diffusion layer plays an important role in ensuring the reliability as described below. During the data-erase operation, the deeply-diffused phosphorus is responsible for reducing an electric-field component parallel to the interface between the semiconductor substrate and the tunnel oxide film, thereby preventing the generation of the tunnel current between bands, which would cause an excessive erase and a nonuniform erase. This role of phosphorus is described on page 56–57 of "Flash Memory Technical Handbook" published by Science Forum.

However, since the concentration of diffused phosphorus required for attaining the reliability is relatively high, it is difficult to form a narrow tunnel region. This is one of the obstacles to miniaturization of memory cells. In this circumstance, the demand for the miniaturization has been fulfilled by the SAS (self-aligned source) technology, more specifically, the techniques disclosed in U.S. Pat. No. 4,500,899 and in U.S. Pat. No. 5,019,527, in combination.

FIGS. 2 to 7 are views for explaining a conventional memory device. FIGS. 2A, 3A, 4A 5A and 6A are cross sectional views taken along the line a—a which crosses a word line of the memory cell at a right angle. On the other hand, FIGS. 2B, 3B, 4B, 5B and 6B are cross sectional views taken along the line b—b drawn almost at a center of the region sandwiched between adjacent memory cells with no floating gate electrode and crossing the word line at a right angle (hereinafter, this region will be referred to as "cell slit"). FIG. 7 is a magnified view of a portion 215 shown in FIG. 6A.

As shown in FIGS. 2A and 2B, on a P-type silicon substrate 201, a P-layer 202 for preventing field inversion and a field oxide film 203 are provided. On the region of the P-type silicon substrate 201 excluding the field oxide film 203, a tunnel oxide film 204 (hereinafter referred to as "first gate insulating film") is provided. On the first gate insulating film 204, a floating gate electrode 205, an ONO ($SiO_2/Si_xN_y/SiO_2$) film 207 (hereinafter referred to as "second insulating film"), a control gate electrode 208 are formed in a sequential manner. Thereafter, a photo resist 210 is formed on the region excluding at least the source diffusion layer and a diffusion layer for wiring between source diffusion layers (hereinafter referred to as "source wiring region").

Next, as shown in FIGS. 3A and 3B, the first gate insulating film 204 and the field oxide film 203 on the source diffusion layer and the source wiring layer are removed by etching and then the resist pattern 210 is removed. Thereafter, a post oxide film 211 is formed and then a photo resist 212 is formed on the area excluding the source diffusion layer and source wiring region.

Further, as shown in FIGS. 4A and 4B, using the resist pattern 212 as a mask, phosphorus ions are implanted in the source diffusion layer and source wiring region. After the resist pattern 212 is removed, annealing is performed at high temperature to activate phosphorus ions implanted in the step of FIGS. 4A and 4B and to control the thickness of the source diffusion layer to a level required for ensuring reliability.

As shown in FIGS. 5A and 5B, with the purpose of forming a drain and increasing the concentration of impurities of a source surface, the arsenic ions are implanted in the entire surface including the source wiring region and then activated by heat treatment.

As shown in FIGS. 6A and 6B, using phosphorus having a high diffusion coefficient and high-temperature annealing for diffusion, a source erase type flash EEPROM thus formed will acquire a source diffusion layer formed sufficiently deep to ensure reliability. Furthermore, to make high-density memory cells, the EEPROM is miniaturized in the manufacturing steps by the application of the SAS technology. The resultant structure shown in FIGS. 6A, 6B, and 7 includes phosphorus doped source 213b, phosphorus doped source wiring layer 213c, drain 214a, arsenic doped source 214b, and arsenic doped source wiring layer 214c.

It is possible to introduce phosphorus into the source diffusion layer by using the resist pattern 210 as a mask, in the steps of FIGS. 2A and 2B. In this case, a resist pattern 212 is not required. However, impurities are implanted in the source diffusion layer while the P-type silicon substrate 201 is being exposed, so that heavy metal impurities are introduced into the P-type silicon substrate 201. The heavy metal impurities thus implanted are known to cause a problem with an increase of a junction leak. Therefore, after the mask of the resist pattern 210 is removed, the following procedure is generally taken. That is, the post oxide film 211 is formed; the same resist pattern 212 as the resist pattern 210 is formed; and phosphorus is introduced. In these steps, the post oxide film 211 serves as a mask for blocking a problem of the heavy-metal impurities during phosphorus implantation.

In the source erase type flash EEPROM mentioned above, it is important to prevent an excessive erase and a nonuniform erase. For example, if there is a memory cell erased excessively by the erase operation, the potential of a word line will not elevate. As a result, a fatal defect occurs in that a read/write operation is not carried out. If there is a nonuniform erase, a high speed read/write operation cannot be carried out. In addition, miss writing will occur. Then, in the semiconductor device manufactured in accordance with the aforementioned steps, phosphorus is introduced into the source diffusion layer by ion implantation to form a deep diffusion layer and thereby reducing the electric field component parallel to the interface between the semiconductor substrate and the first gate insulating film during the erase operation. Due to such a construction, the generation of a tunnel current between bands, which has a negative effect on the reliability is prevented.

However, in the aforementioned construction, miniaturization of the memory cells and high-density memory cells required for increasing the capacity cannot be achieved. The reasons will be described below.

First of all, the reliability (as to an excess erase and nonuniform erase) inherent in the EEPROM, will be described briefly. When an oxide film, which has been damaged in the implantation step of phosphorus and arsenic ions for the formation of the source diffusion layer shown in FIGS. 4A, 4B, 5A and 5B, still remains unrecovered from the damage, an F-N current path 217 is generated also in the area other than an area 216 which the F-N current primarily passes through during the erase operation, as shown in FIG. 7. The path thus formed will cause an excessive erase and a nonuniform erase. To prevent the problems during the erase operation, it is necessary to reduce the damage during the ion implantation. To reduce the damage, an underlying oxide film 211 must be prepared thick in preparation for the phosphorus or arsenic ions implantation performed for forming the source diffusion layer. In addition, if the annealing treatment is performed, but insufficient after the implantation step shown in FIGS. 4A and 4B, the diffusion layer will not be formed deep enough to prevent the generation of a tunnel current between bands. Therefore, the annealing must be performed for a long time at high temperature. As a natural consequence, more heat treatment steps are required and the process temperature is also increased. As a result, the channel control of a single layer type transistor element present on the same substrate becomes difficult, with the result that the miniaturization of the single layer type transistor element constituting a peripheral circuit will be inhibited.

On the other hand, if a source diffusion layer is formed deep to improve the reliability of the memory cells, the depth of the diffusion layer of the source wiring area 213c will be increased. In this case, impurities enter into the area right under the field oxide film 203 which separates adjacent drain diffusion layers 214a from each other, increasing the leak between bit lines. The leak is caused by a high potential application, for example, about 7 V and 12.5 V to the bit line and the word line 208 which constitute a cell to be written, respectively. At this time point, a difference in potential is generated between the drain constituting the cell ready for writing and the drain of an adjacent cell having a word line 208 in common. In a conventional memory cell, if the source diffusion layer is uniformly deep, the source diffusion layer enters into part of the surface of the silicon substrate 201 right under the word line 208 and the field oxide film 203. Hence, an inverted layer is likely to appear during a writing operation, increasing the leak between bit lines. To be more specific, a high potential is applied to the drain during the writing operation; however, the potential for writing is decreased by the leak between bit lines. As a result, in some cases, write failure, write error, or data drop occurs. To prevent the leak between bit lines, the width and thickness of the field oxide film 203 interposed between adjacent memory cells must be increased. This is a big obstacle to memory-cell miniaturization. Attempts to miniaturize the memory cells by eliminating the obstacle using the SAS technology almost have reached their limit, at present. Therefore, it is difficult to further increase the memory capacity by the SAS technology.

To increase the capacity of the semiconductor memory, the approaches depending on miniaturizing processing techniques, which attain miniaturization by decreasing the sizes of memory cells and thereby increasing the density thereof, are insufficient. Efforts must be given not only to realize high-density memory cells but also to attain high-speed read/write and erase operations. If not, market requirements will not be satisfied. In addition, the manufacturing cost is increased since it takes a long time for a product to be tested before shipment. As is well known, in the memories such as an EPROM and an EEPROM using a second gate insulating film 207 sandwiched between a floating gate electrode and a control gate electrode, as a capacitance for data storage, if a sufficient capacitance volume of the second gate insulating film 207 is ensured, a high-speed write and high speed erase will be realized, resulting in shortening the test time. Moreover, a high channel current will result which enables a high-speed reading. To ensure the capacitance volume of the second gate insulating film 207, known are only two methods: one is to reduce the thickness of the second gate insulating film 207; and the other is to increase the area of the second insulating film 207. However, the latter method naturally offers a problem in that the memory cells are enlarged.

In the former case, it is necessary to reduce the concentration of impurities present in the polysilicon serving as a material for the floating gate electrode, in advance. The silicon doped with a large amount of impurities exhibits an accelerated oxidation effect, which accelerates an oxidation rate of the silicon. To describe more specifically, in the case where the polysilicon serving as a material for the floating gate electrode is doped with a large amount of impurities, it will be difficult to make a $SiO_2$ film thin, which is the lowermost layer constituting the second insulating film 207.

However, if the polysilicon 205 serving as the floating gate electrode contains impurities in a low amount, it is known that sharp protrusions appear at a grain corner portion and an etching corner portion due to an oxidation stress during oxidation and heat treatment carried out in the second insulating film 207 formation step, in the post oxidation film 211 formation step, and an annealing step after the phosphorus ion implantation shown in FIGS. 4A and 4B. The protrusion causes the convergence of the electric field, which further causes problems in data storage and in data erase such as an excessive erase and a nonuniform erase.

To explain this more specifically referring to FIG. 7, when the concentration of impurities is low, a sharp protrusion is generated at the corner of the floating gate electrode 205 by the oxidation (heat) stress. In short, not only in the primary F-N current path 216, but also in the electric-field converged protrusion, the F-N current path 217 is formed. As a result, the nonuniform erase and excessive erase will frequently occur. The only way to prevent the generation of the path is to suppress the protrusion of the corner of the floating gate electrode 205. To suppress the protrusion, a thermal treatment step performed at an extremely high temperature, e.g. 1000° C. is required. However, in this case, it is difficult to miniaturize memory cells, as mentioned previously.

SUMMARY OF THE INVENTION

In conventional memory device, there are problems of an increase in a leak between bit lines caused by a heat treatment step and a difficulty in ensuring a capacitance volume of a second gate insulating film. Because of the problems, it has been difficult to enlarge memory capacity, to improve reliability, and to achieve a high-speed operation.

The object of the present invention is to provide a semiconductor device and a method of manufacturing the same as follows:

(a) Semiconductor device, capable of being operated at a high speed, and having a large capacity and a high reliability; and (b) Method of manufacturing a semiconductor device suitable for attaining yield improvement, miniaturization and low cost.

To overcome the aforementioned problems and to attain the objects, the semiconductor device and its manufacturing method of the present invention are constituted as follows:

(1) The semiconductor device of a first embodiment of the present invention has at least two transistors constituting a memory cell, which comprises:
 a semiconductor substrate of a first conductive type;
 a source formed on a surface of the semiconductor substrate by diffusing an impurity of a second conductive type to a first depth;
 a drain of a second conductive type formed electrically separated from the source and formed on a surface of the semiconductor substrate;
 a first insulating film formed on a surface of a channel region between the source and the drain;
 a first gate electrode formed on a surface of the first insulating film; and
 a second insulating film formed on a surface of the first gate electrode.

The semiconductor device of the first embodiment further comprises the source wiring layer which is formed by diffusing an impurity of a second conductive type in the semiconductor substrate to a second depth shallower than the first depth, and which is connected to the source of each of the at least two transistors.

In the semiconductor-device of the first embodiment, since the first depth of the source diffusion layer is large, a concentration of the impurity is increased accordingly. Consequently, the insulating film on the source becomes thick and therefore hardly damaged during impurity-ion implantation. Furthermore, since the first depth of the source diffusion layer is large, the generation of the leak between bands, which adversely affects the reliability during an erase operation, can be suppressed. In addition, since the second depth of impurity-diffused layer of the source wiring layer can be selectively controlled to be shallow, the source diffusion layer will not enter into a surface of the silicon substrate right under a word line and a field oxide film. Hence, unlike a conventional semiconductor device, an invert layer is hardly formed during the write operation, reducing the leak between bit lines. Therefore, the semiconductor device can be miniaturized with reliability.

In a second embodiment of the present invention, the semiconductor device has at least two transistors constituting a memory cell, which comprises:
 a semiconductor substrate of a first conductive type;
 a source formed of double diffusion layers of two kinds of second conductive type impurities, formed on a surface of the semiconductor substrate;
 a drain of a second type conductive type, electrically separated from the source and formed on a surface of the semiconductor substrate;
 a first insulating film formed on a surface of a channel region between the source and the drain;
 a first gate electrode formed on a surface of the first insulating film;
 a second insulating film formed on a surface of the first gate electrode; and
 a source wiring layer which is connected to a source of each of the transistors and formed by diffusing an impurity of a second conductive type in the semiconductor substrate.

The semiconductor device of the second embodiment further comprises a source wiring layer having one kind of a second conductive type impurity diffused therein and connected to the source of each of the at least two transistors.

In the semiconductor device of the second embodiment, since the source diffusion layer is composed of a double diffusion layer, the impurity concentration of the source diffusion layer is readily increased and thus an oxide film formed on the source region becomes thick. Hence, damage hardly occurs during impurity-ion implantation. Furthermore, since the double diffusion layer of the source can be easily deepened, the generation of the leak between bands, which adversely affects the reliability, can be suppressed during the erase operation.

In a third embodiment of the present invention, the semiconductor device has at least two transistors constituting a memory cell, which comprises:
 a semiconductor substrate of a first conductive type;
 a source and a drain of a second conductive type formed on a surface of the semiconductor substrate of a first conductive type, in an electrically separated manner;
 a first insulating film formed on a surface of a channel region between the source and drain;
 a first gate electrode formed on a surface of the first insulating film;
 a second insulating film formed on a surface of the first gate electrode;
 a third insulating film formed on a surface of the drain;
 a source wiring layer connected to a source of each of the at least two transistors by diffusing an impurity of a second conductive type in the semiconductor substrate;
 a fourth insulating film formed on a surface of the source wiring layer; and
 a fifth insulating film formed on a surface of the source of each of the at least two transistors, and having a thickness equal to or more than the thickness of one of the third insulating film and the fourth insulating film.

In the semiconductor device of the third embodiment, the fifth insulating film on the source surface is relatively thick, and damage is hardly produced during impurity ion implantation.

In a fourth embodiment of the present invention, the semiconductor device according to the third embodiment further comprises a second gate electrode formed on a surface of the second insulating film;
 wherein the transistors are a multilayer gate type transistor and the source wiring layer and the drain are formed by diffusing an impurity of the same second conductive type.

In the fourth embodiment, since the drain and the source wiring layer are formed of an impurity of the same second conductivity, it is easy to manufacture them.

(2) The method of manufacturing the semiconductor device of a fifth embodiment of the present invention comprises:

a first step of forming a field oxide film for element separation on a semiconductor substrate of a first conductive type and forming a first insulating layer on the semiconductor substrate excluding the field oxide film, and then forming a first conducting film on the first insulating film;

a second step of forming a second insulating film and a second conducting film on the first conducting film in a sequential manner;

a third step of etching the second conducting film, the second insulating film, and the first conducting film to form a gate electrode;

a fourth step of implanting an impurity ion of a second conductive type in a predetermined source forming region through the first insulating film, by using a resist pattern having the predetermined source forming region at least exposed;

a fifth step of removing a first insulating film present on the predetermined source forming region by etching and removing the resist pattern;

a sixth step of forming a post oxide film over the entire surface of the resultant structure by thermal oxidation; and a seventh step of implanting an impurity ion of a second conductive type in the semiconductor substrate through the post oxide film to form a source wiring layer connecting between a drain and the source, thereby forming a multilayer gate type transistor.

With the method of manufacturing a semiconductor device of the fifth embodiment, the oxide film received damage during the impurity implantation step (fourth step) is completely removed in the etching step performed later. Furthermore, the concentration of impurities is increased by the implantation of impurities performed in the fourth step. As a result, a thick post oxidation film is formed exclusively on the predetermined source region in which an oxidation rate is increased by the known accelerated oxidation. Hence, the influence of the damage received in the seventh step is mitigated; at the same time, the depths of the diffusion layer of the drain region and the source wiring layer are rendered shallow. Since the accelerated oxidation effect due to the impurity-ion implantation is used, a high-temperature heat treatment step is not required to diffuse impurities. In addition, the annealing for deepening the impurities, which are implanted in the fourth step, is carried out simultaneously in the heat treatment step of after oxidation, the heat treatment steps are reduced in number. Hence, the manufacturing method of the present invention is suitable for miniaturizing a semiconductor device and reducing a manufacturing cost. Furthermore, implantation of a second conductive type impurity and etching of the first insulating film are performed simultaneously using the same resist pattern, so that the number of manufacturing process steps are reduced, contributing to a reduction in the manufacturing cost. Moreover, the depth of the diffusion layer is easily controlled and a decrease of an effective channel length is attained to a minimum level. As a result, miniaturization of the cells can be attained.

In a sixth embodiment of the present invention, the removal of a first insulating film present in the predetermined source formation region is removed by etching simultaneously with the removal of the field oxide film present on the predetermined source wiring layer formation region, in the step corresponding to the sixth step of the fifth embodiment.

In the method of manufacturing a semiconductor device of the sixth embodiment, the first insulating film and the field oxide film are simultaneously etched in the fifth step. Hence, the number of manufacturing steps can be reduced, contributing to a reduction in the manufacturing cost.

In the seventh embodiment of the present invention, at least two transistors of a multilayer gate type which are adjacent to each other have a common source positioned between gate electrodes of each of the transistors. When impurity-ions of a second conductive type are implanted in the source of one of two transistors in the fourth step of the embodiment 5, the impurity-ions are injected from the other transistor side at an angle of larger than 0° C. and less than 90° C. to the normal of the semiconductor substrate.

In the method of manufacturing a semiconductor device mentioned above, since the injection angle of impurity ions of a second conductive type is not a right angle, it is possible to control the impurities so as to be present at an etching corner portion of the first conducting film exclusively in a high concentration. As a result, an oxidation stress of the etching corner in the post oxidation step will be mitigated. Subsequently, convergence of the electric field is suppressed, thereby preventing generation of the F-N current path. Therefore, it is not necessary to contain impurities of the floating gate electrode in a large amount, with the result that thickness of the second insulating film serving as a capacitance for data storage can be reduced. Hence, miniaturization of the semiconductor device and a quick operation thereof are accomplished, reducing a testing time remarkably.

In an eighth embodiment of the present invention, if the distance between the gate electrodes of the adjacent two multilayer gate transistors is defined as X, and the height of the gate electrodes is defined as Y, then, the injection angle of impurity-ions of a second conductive type relative to the normal of the semiconductor substrate is larger than 0 and $\tan^{-1}(X/Y)$ or less.

In the method of manufacturing a semiconductor device of the present invention, since the injection angle of impurity-ions of the fourth step is $\tan^{-1}(X/Y)$ or less, the impurity-ions are implanted in the semiconductor substrate without fail.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 10A and 10B are cross sectional views of a semiconductor device according to an embodiment of the present invention for explaining the manufacturing method;

FIGS. 11A and 11B are cross sectional views of a semiconductor device according to an embodiment of the present invention for explaining the manufacturing method;

FIGS. 13A and 13B are cross sectional views of a semiconductor device according to an embodiment of the present invention for explaining the manufacturing method; and FIG. 14 is a magnified view of a semiconductor device according to an embodiment of the present invention.

DETAILED DESCRIPTION OF THE PREFERRED EMBODIMENTS

Figure 1:
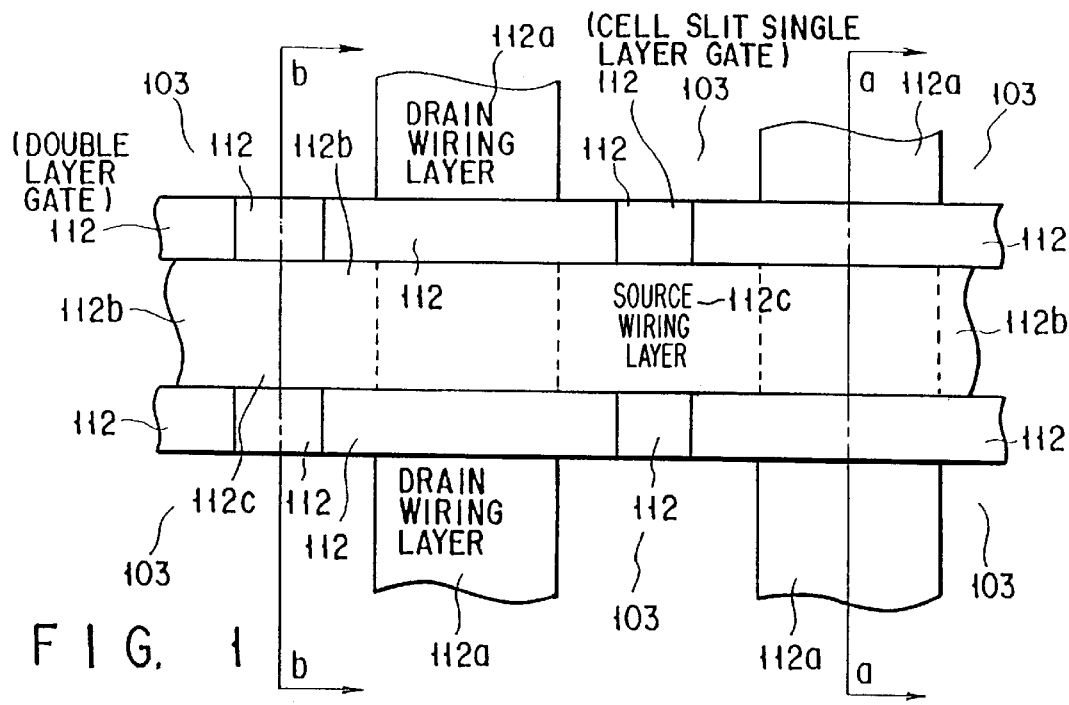
FIG. 1 is a plan view of a semiconductor device of the present invention.
Figure 2A:
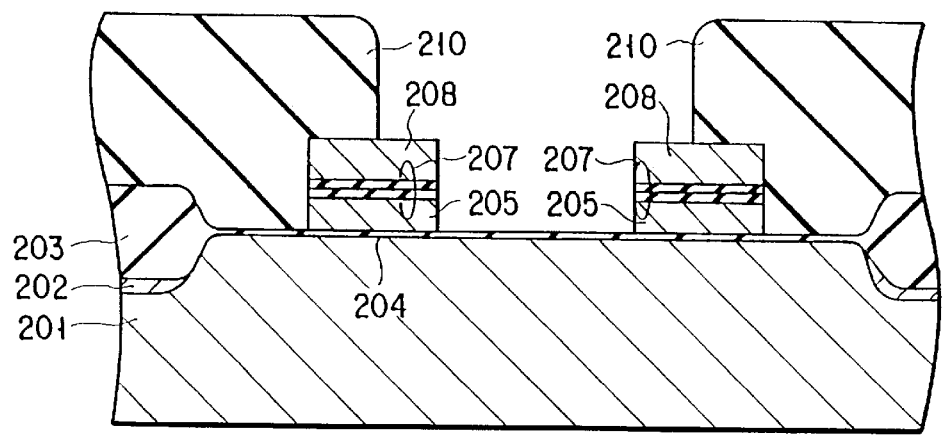
FIGS. 2A and 2B are cross sectional views of a conventional semiconductor device for explaining the manufacturing method.
Figure 2B:
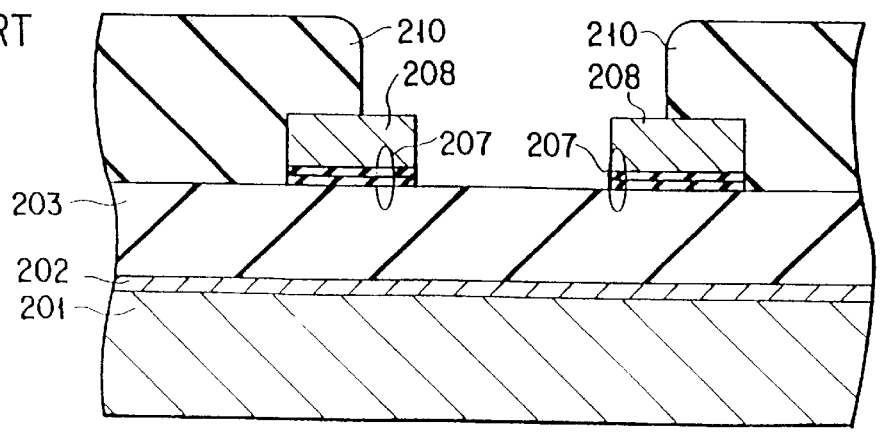
Figure 3A:
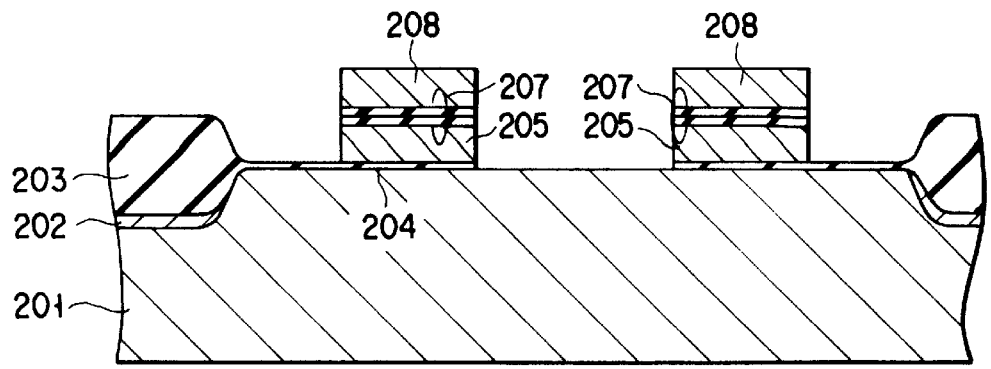
FIGS. 3A and 3B are cross sectional views of a conventional semiconductor device for explaining the manufacturing method.
Figure 3B:
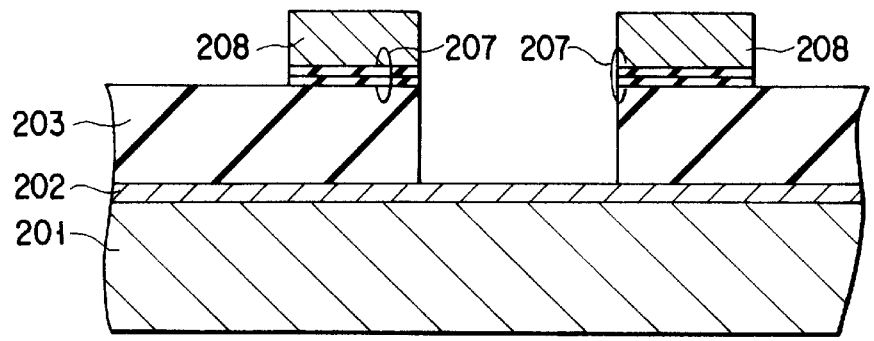

Hereinbelow, the semiconductor device and the manufacturing method thereof according to embodiments of the present invention will be described with reference to accompanying drawings.

In FIGS. 1 and 8A to 14, shown are structures of the semiconductor devices according to embodiments of the present invention serving as a two-layer gate flash EEPROM of a source erase type for explaining the steps of manufacturing the same. FIGS. 8A, 9A, 10A, 11A, 12A and 13A are the cross sectional views taken along the line a—a of the memory cell portion, which crosses a word line at a right angle. On the other hand, FIGS. 8B, 9B, 10B, 11B, 12B and 13B are the cross sectional views taken along the line b—b of the region including a cell slit, which crosses a word line at a right angle. FIG. 14 is a magnified view of a portion 115 of FIG. 13A.

On the surface of a P-type semiconductor substrate 101, an oxide film 103 for element separation (600 μm-thick) and a field P-layer 102 are formed by the LOCOS (local oxidation of silicon) method. After a first gate insulating film 104 (tunnel gate oxide film) of 10 nm-thick is formed by thermal oxidation on the semiconductor substrate, a polycrystalline silicon 105 serving as a floating gate electrode is deposited to 100 nm by the LPCVD method. Then, phosphorus is doped by the $POCl_4$ method so as to be contained at an impurity surface concentration of $1 \times 10^{20}/cm^3$.

Figure 8A:
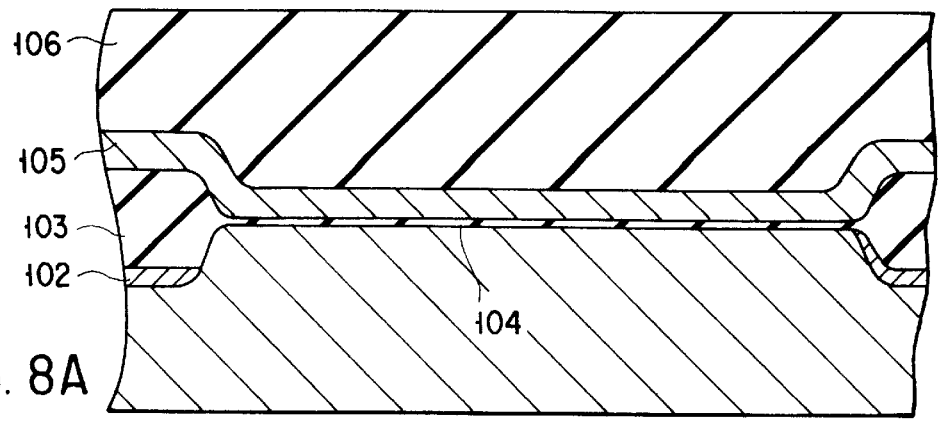
FIGS. 8A and 8B are cross sectional views of a semiconductor device according to an embodiment of the present invention for explaining the manufacturing method.

Subsequently, as shown in FIG. 8A, a resist pattern 106 is formed by lithography on the area excluding at least a cell slit for separating a floating gate electrode and a source wiring region. Thereafter, etching is performed using the resist pattern 106 as a mask. Then, an oxide film of 6 nm is formed by thermal oxidation at 850° C. On the oxide film, a SiN film is deposited to 20 nm by the LPCVD method. Furthermore, wet oxidation is applied thereto at 950° C. (to form a second gate insulating film 107. Subsequently, polycrystalline silicon 108 serving as a control gate electrode is deposited to 400 nm by the LPCVD method.

Figure 9A:
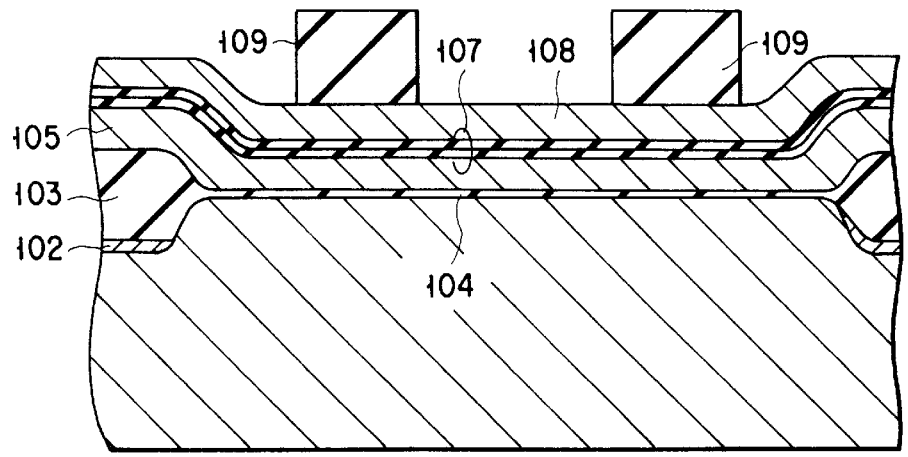
FIGS. 9A and 9B are cross sectional views of a semiconductor device according to an embodiment of the present invention for explaining the manufacturing method.
Figure 9B:
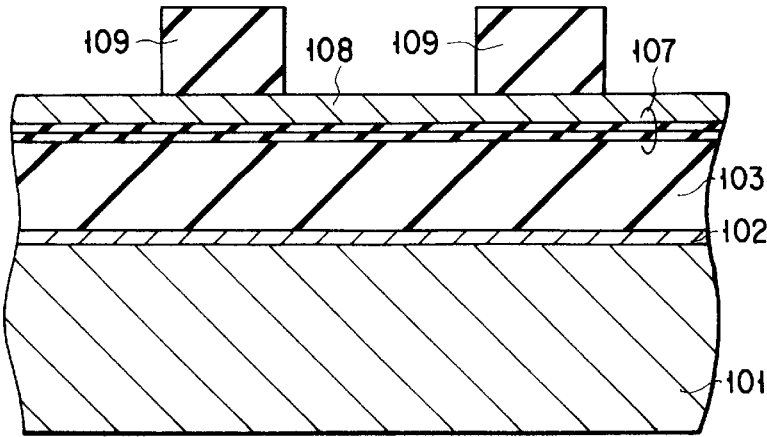

After a phosphorus impurity is doped by the $POCl_4$ method, as shown in FIGS. 9A and 9B, a resist pattern 109 is formed on a word line pattern including gate electrode 105, the second gate insulating film 107, and the polycrystalline silicon 108.

Using the resist pattern 109 as a mask, the polycrystalline silicon 108, the second gate insulating film 107, and the polycrystalline silicon 105 are etched. After the resist pattern 109 is removed, a resist pattern 110 is formed on the area excluding at least a predetermined source formation region and a source wiring region.

Then, as shown in FIGS. 10A and 10B, using the resist pattern 110 as a mask, phosphorus ions are doped at a dose of $1 \times 10^{15}/cm^2$ in the direction of, for example, an arrow 111a or 111b indicated in FIGS. 10A and 10B, which has an angle of 20° to the normal of the surface of the P-type semiconductor substrate 101, with an acceleration energy of 35 keV, while a wafer is being rotated.

Figure 11B:
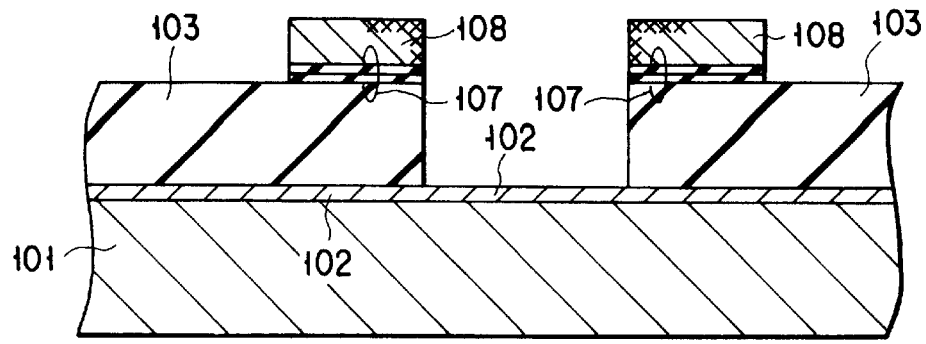

After the first gate insulating film 104 present in the predetermined source formation region and the oxide film 103 for element separation present in the source wiring region are simultaneously removed by using the resist pattern 110 as a mask as shown in FIGS. 11A and 11B, the resist pattern 110 is removed.

Subsequently, thermal oxidation is applied at 850° C. to form post oxide films 112, 112a, 112b, and 112c. At this point, the thickness, $Tox_3$ of the post oxide film 112c is about 10 nm, as shown in FIGS. 13A and 13B. The thickness, $Tox_1$ of the post oxide film 112b present on the predetermined source formation area is about 20 nm by the accelerated oxidation effect. In short, $Tox_1$ and $Tox_3$ have the relationship of $Tox_1 > Tox_3$. On the other hand, as a result of the oxidation, the oxide film 104 on the predetermined drain formation region appears slightly thicker than before. Hence, the thickness ($Tox_2$) of the oxide film 112a including the oxide film 104 and $Tox_1$ satisfy the relationship: $Tox_1 > Tox_2$.

Figure 12A:
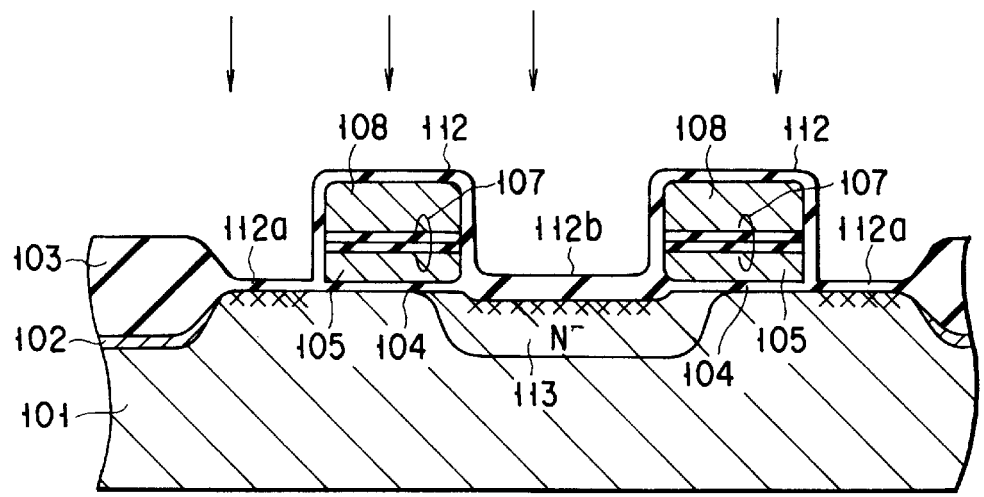
FIGS. 12A and 12B are cross sectional views of a semiconductor device according to an embodiment of the present invention for explaining the method of manufacturing the same.
Figure 12B:
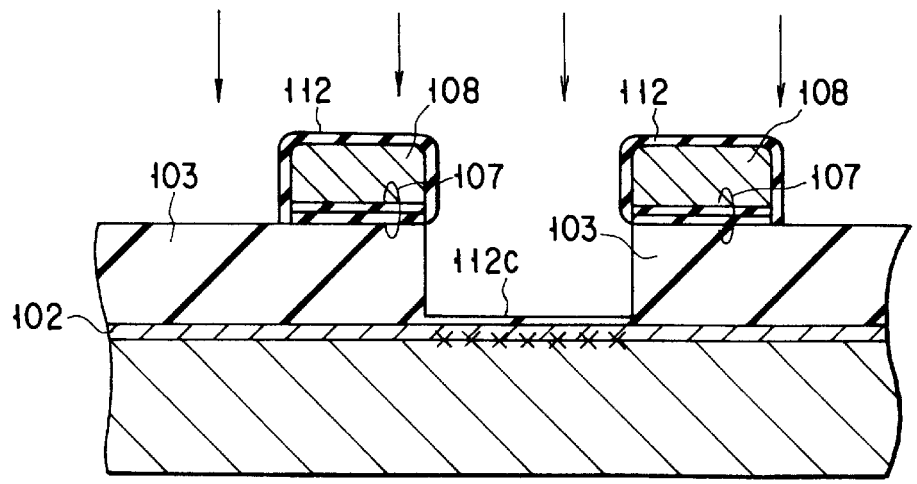

Thereafter, as shown in FIGS. 12A and 12B, arsenic ions are implanted at a dose of $5 \times 10^{15}/cm^2$ with an acceleration energy of 55 keV.

The arsenic ions doped are activated by the annealing performed at 850° C. in a $N_2$ atmosphere to form a drain diffusion layer 114a and a region 114b containing a large amount of arsenic ions in the surface of the source diffusion layer 113, as shown in FIGS. 13A and 13B. The depth of the diffusion layer of the source diffusion layer 113 is defined as $Xj_1$. If the depth of the drain diffusion layer 114a is defined as $Xj_2$, and the depth of the diffusion layer 114c of the source wiring region as $Xj_3$, then, $Xj_2$ is approximately equal to $Xj_3$. Therefore, the relationship: $Xj_1 > Xj_2$ and $Xj_1 > Xj_3$ are obtained.

Afterward, an Al wiring layer and a passivation film and the like are formed (we will not describe in detail) by using well known techniques, thereby obtaining a two-layer gate flash EEPROM of a source erase type.

In the meantime, in the steps shown in FIGS. 10A and 10B, in which phosphorus ions are implanted at a dose of $1 \times 10^{15}/cm^2$ with an acceleration energy of 35 keV, using the resist pattern 110 as a mask while a wafer is being rotated, it is not necessary to inject the ions diagonally to the normal of the surface of the P-type semiconductor substrate 101. In this case, the injected ions are reflected, thereby increasing the concentrations of impurities present in the side and edge portions of the floating gate electrode 105. This method is effective in the case where an ion implantation device is incapable of controlling the injection angle as desired. If miniaturization of the memory cells is further required, it is necessary to suppress the phosphorus ion diffusion of a lateral direction to a minimum. As a natural consequence, it may be better to carry out the injection of impurity ions without being inclined, to ensure an effective channel length.

The reason why phosphorus ions are implanted at an angle inclined to the normal of the surface of the P-type semiconductor substrate while a wafer is being rotated is to prevent an unsymmetrical arrangement of the resultant source diffusion layer to the memory cell between the word lines. Instead of rotating the wafer, ions may be implanted in an inclined direction at the same angle to all word lines. Alternatively, ions may be implanted in various directions in a plurality of times. In contrast, when implantation is carried out at a right angle to the substrate, the unsymmetrical arrangement of the source diffusion layer to the memory cell between the word lines sandwiching the source diffusion layer will not take place. Therefore, it is not necessary to implant the ions while the wafer is being rotated in various directions.

Although the phosphorus ions are implanted using the resist pattern 110 as a mask in the above, arsenic ions may be used instead of the phosphorus ions. The arsenic ions have a smaller diffusion velocity in silicon than the phosphorus ions and are effective to form more miniaturized cells. As necessary, the ions are implanted at an angle inclined to the substrate.

When a quick write/erase operation is required, it is necessary to control an impurity concentration independently in the drain diffusion layer formation step and in the source diffusion layer formation step. In this case, the predetermined drain formation region is masked with a resist pattern in the steps of FIGS. 12A and 12B and impurities are introduced into the predetermined drain formation region in the later step. Alternatively, in the steps prior to the steps of FIGS. 12A and 12B, impurities may be introduced.

In the steps of FIGS. 12A and 12B, the predetermined source formation region is masked with a resist pattern and impurities may be introduced exclusively into the predetermined drain formation region and source wiring region. Even if the depth of the drain diffusion layer is shallow, a write operation can be executed. However, if the cells have to be further miniaturized, the diffusion layer may be formed further shallower. The diffusion layer of the source wiring region is desired to be shallow. The shallow diffusion layer is effective to reduce the leak between bit lines.

Figure 4A:
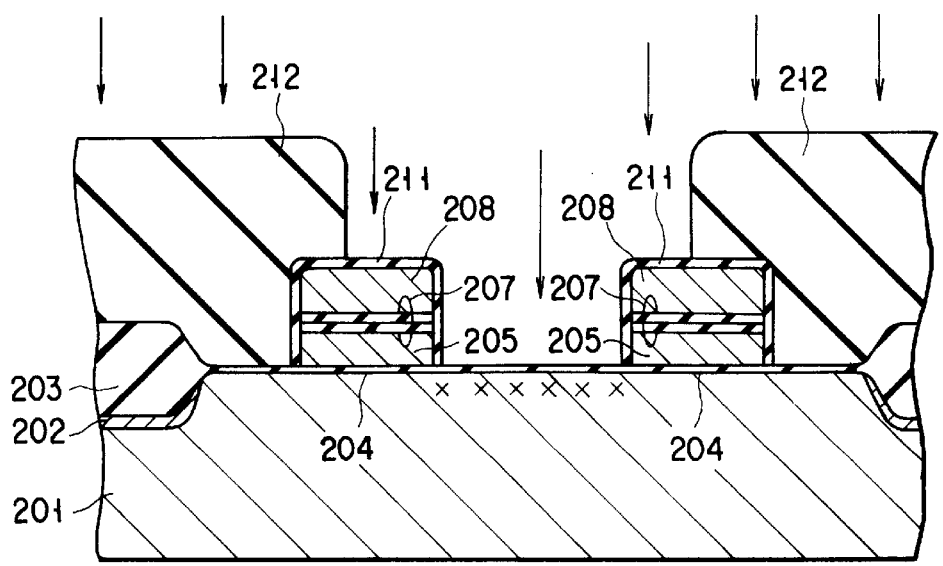
FIGS. 4A and 4B are cross sectional views of a conventional semiconductor device for explaining the manufacturing method.
Figure 4B:
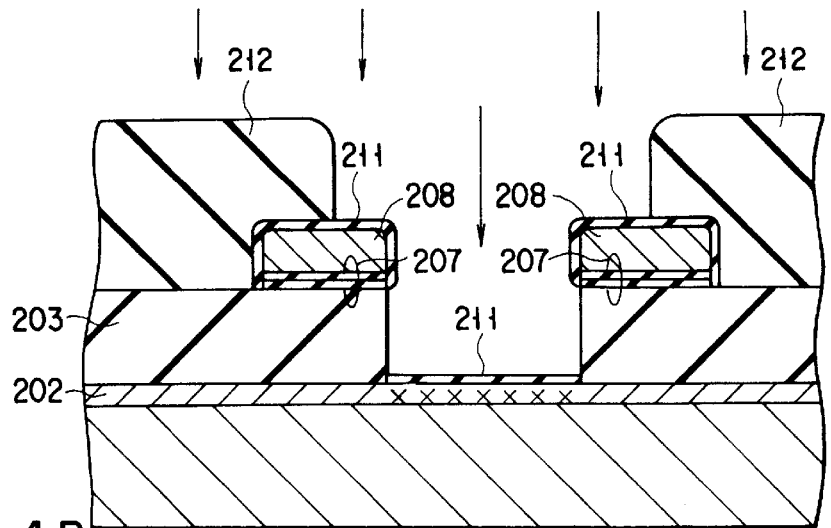

In an embodiment of the present invention, the oxide film 104 is removed after ions are implanted in the predetermined source formation region and the source wiring region, as shown in FIG. 11A and 11B. Therefore, a step of recovering the oxide film from the damage received by the ion implantation is no longer required. The only step required is to control the depth of the source diffusion layer in order to ensure the reliability. Consequently, a decrease in the effective channel length associated with the formation of the deep diffusion layer can be suppressed to a minimum level. Furthermore, the control of the depth of the diffusion layer is effective in miniaturizing the cells. The reduction of the treatment step is effective in reducing the manufacturing cost. The same phenomena described above can be adapted to the case in which arsenic ions are used as the impurity in forming the source diffusion layer 113 deep. On the other hand, in the formation of a source diffusion layer 213 according to a conventional method, the heat treatment step is required to recover the oxide film from the damage received by ion implantation as in FIGS. 4A and 4B and thereby to improve the reliability (to reduce leak between bit lines). This is a big obstacle to miniaturization.

Figure 5A:
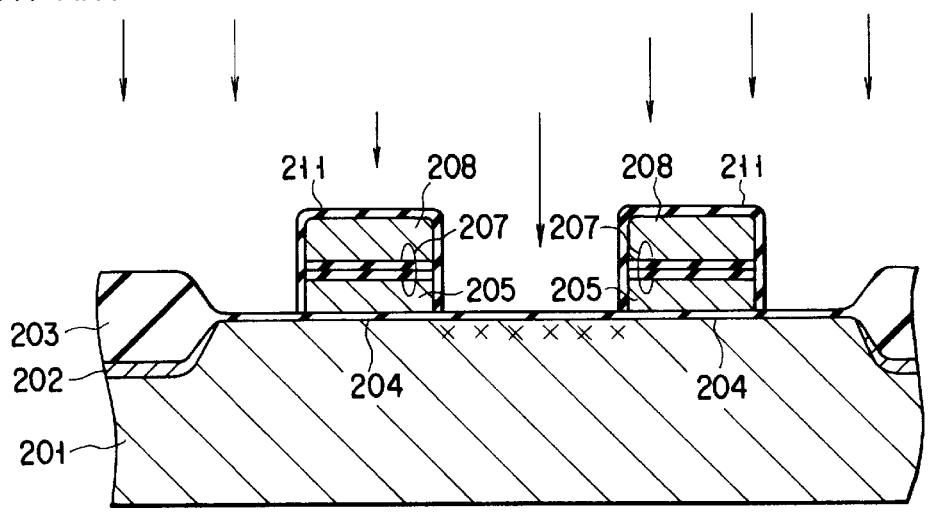
FIGS. 5A and 5B are cross sectional views of a conventional semiconductor device for explaining the manufacturing method.
Figure 5B:
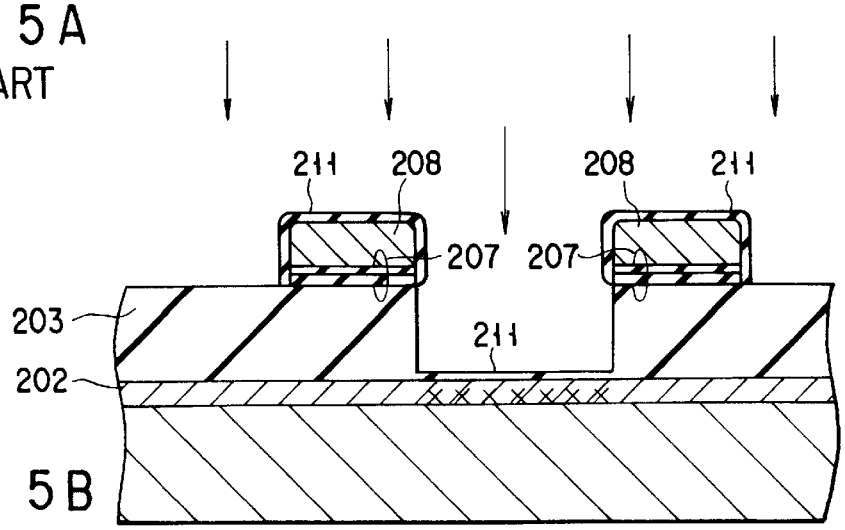
Figure 6A:
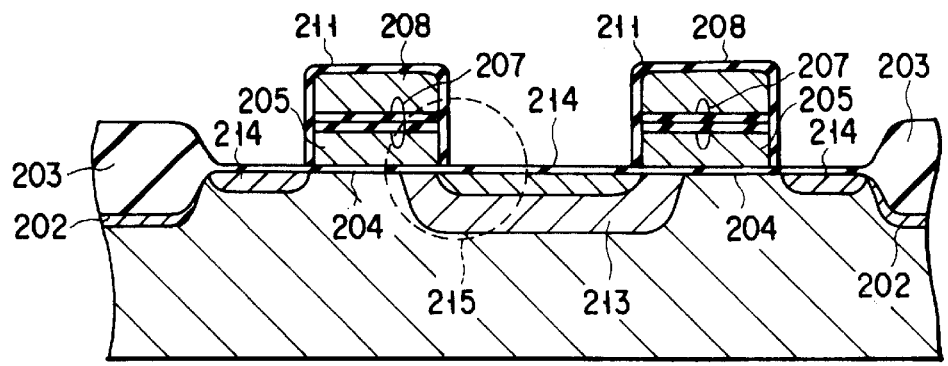
FIGS. 6A and 6B are cross sectional views of a conventional semiconductor device for explaining the manufacturing method.
Figure 6B:
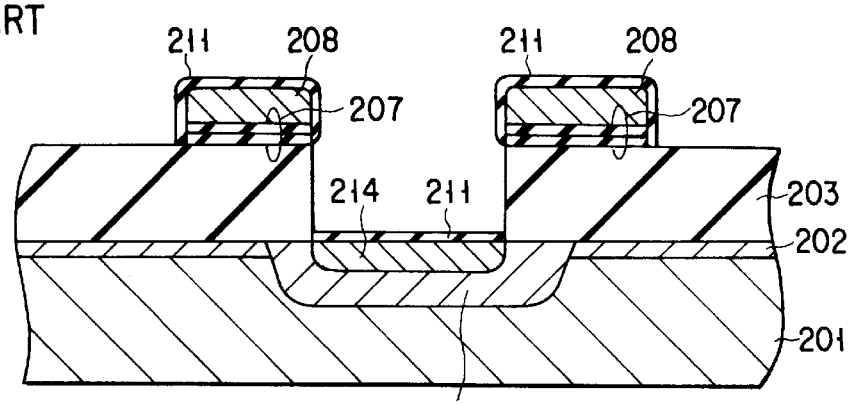
Figure 7:
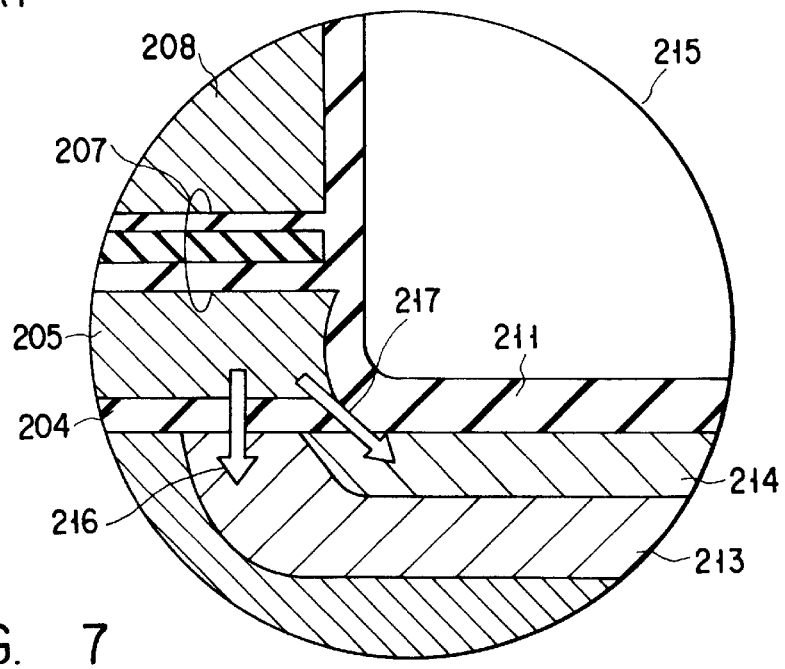
FIG. 7 is a magnified view of a cross section of the conventional semiconductor device.

In the post oxide film formation step performed prior to the arsenic ion implantation step, the oxide film is formed sufficiently thick on the predetermined source formation region due to the accelerated oxidation effect caused by impurities contained in a large amount in the predetermined source formation region. Accordingly, the damages generated in the oxide film by the arsenic ion implantation as shown in FIGS. 12A and 12B will not bring a harmful effect. Therefore, a step of recovering the damage caused by arsenic ions is no longer required. The only step required is to perform heat treatment for activating the arsenic ions implanted in the semiconductor substrate. To be more specific, a relatively thick post oxide film 112b may be formed in a heat treatment step at a relatively low temperature of about 850° C. Through these steps, the reduction of the effective channel length can be obtained to a minimum level, attaining miniaturization of the cell, effectively. The heat treatment step performed at a relatively low temperature is not only effective in miniaturizing of peripheral elements other than the memory cells, but is also effective in the reduction of the manufacturing cost. On the other hand, when a conventional source diffusion layer 214 is formed as shown in FIGS. 5A and 5B, the damage generated by arsenic ion implantation causes an abnormal F-N current path 217. To avoid this problem, a thick post oxide film 211 and high temperature heat treatment for recovering the oxide film from the damage have been required.

The heat treatment step carried out at low temperature as mentioned above is suitable for selectively reducing the depth of the diffusion layer 114c of the source wiring region, as described in the embodiment of the present invention. As a result, the leak between bit lines, and failures such as write fault, write error, and missing data are reduced. Furthermore, the field oxide film formed between memory cells can be reduced in thickness, thereby attaining miniaturization of the cells and improving the reliability.

Since ion implantation is performed to form the source diffusion layer 113 deep by using the resist pattern 110 exclusive to the SAS technology, the resist pattern for the ion implantation exclusive to the formation of the source diffusion layer is not required. For this reason, resist pattern formation and removing steps are no longer required. Accordingly, the manufacturing steps are remarkably reduced in number due to the reduction of the heat treatment steps, with the result that the manufacturing cost is efficiently reduced and the throughput is increased.

In the steps shown in FIGS. 10A and 10B, ion implantation is performed by introducing ions in the direction 111a or 111b having an angle of 20° relative to the normal of the surface of the P-type semiconductor substrate 101 while a wafer is rotated. By performing ion implantation in this manner, impurity ions are controlled so as to be present in a large amount exclusively at the polysilicon corner portion which is susceptible to the electric field convergence. Because of the presence of the impurity of a high concentration, the oxidation stress to be generated at the etching corner portion is mitigated in the post oxidation film formation step, with the result that the generation of a sharp protrusion can be suppressed, as shown in FIG. 14, and only a normal F-N current path 116 is present. In this manner, an abnormal F-N current path is prevented. As a result, an excessive erase and a nonuniform erase will not occur.

Figure 8B:
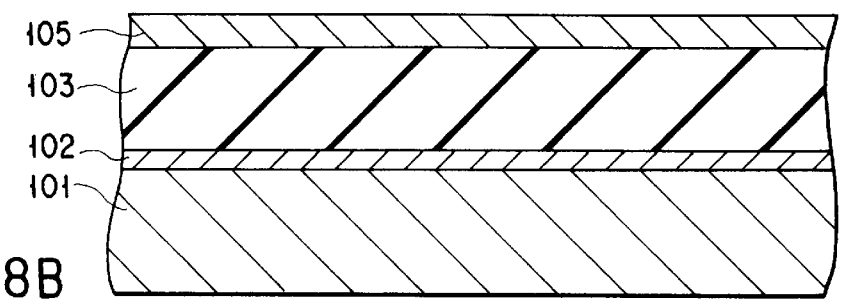

During the doping of impurities into the material of the floating gate electrode 105 performed prior to the steps of FIGS. 8A and 8B, even if the dose of impurities is set to a concentration of about one/fifth the conventional amount, a sharp protrusion was not generated at the etching corner portion of polysilicon, and therefore, no electric field convergence occurred. Hence, by suppressing the concentration of impurities contained in the material of the floating gate electrode 105, the silicon oxide film serving as the second insulating film formed on the floating gate electrode 105 can be formed with a thickness of about 4 nm. As a result, the capacitance between the floating gate electrode 105 and the control gate electrode 108 is obtained in a sufficiently large volume. This is effective to increase an on-current of a memory cell required for high-speed read and write operations.

In this way, the high speed operation is attained, contributing to a reduction of the testing time at the time of shipment and of manufacturing cost.

In the meantime, in the steps shown in FIGS. 10A and 10B, the injection angle of phosphorus ions relative to the normal of the surface of P-type semiconductor substrate 101 is controlled as follows: when the distance between the two-layer gate electrodes of the adjacent two multilayer gate transistors is defined as X, and the height of the two-layer gate electrodes is defined as Y, it is desirable that the injection angle of impurity-ions of a second conductive type relative to the normal of the semiconductor substrate do not exceed $\tan^{-1}(X/Y)$. If the injection angle exceeds $\tan^{-1}(X/Y)$, a desired diffusion layer 113 will not be obtained since most of phosphorus ions do not reach the surface of the semiconductor substrate.

The same effects as those of embodiments of the present invention were obtained also in a double-layer gate flash EEPROM of a source erase type and in a semiconductor device employing the two layer gate flash EEPROM of a source erase type, which has a small/middle memory capacity and is formed by a technique other than the SAS technique.

As is described in the foregoing, according to the present invention, there is provided a semiconductor device and a method of manufacturing the same as follows:

(a) Semiconductor device, capable of being operated at a high speed, and having a large capacity and a high reliability; and (b) Method of manufacturing a semiconductor device suitable for attaining yield improvement, miniaturization and low cost.

Additional advantages and modifications will readily occur to those skilled in the art. Therefore, the invention in its broader aspects is not limited to the specific details, representative devices, and illustrative examples shown and described herein. Accordingly, various modifications may be made without departing from the spirit or scope of the general inventive concept as defined by the appended claims and their equivalents.

What is claimed is:

1. A semiconductor device comprising:
a semiconductor substrate of a first conductivity type;
at least two transistors each including,
    a source having an impurity of a second conductivity type in said semiconductor substrate diffused to a first depth;
    a drain of the second conductivity type, electrically separated from said source and formed on a surface of said semiconductor substrate;
    a first insulating film formed on a surface of a channel region between said source and said drain;
    a first gate electrode formed on a surface of said first insulating film; and
    a second insulating film formed on a surface of said first gate electrode; and
a source wiring layer connected to said source of each of said at least two transistors and having the impurity of the second conductivity type in said semiconductor substrate diffused to a second depth shallower than the first depth.

2. The semiconductor device according to claim 1, wherein each of said at least two transistors further comprises a second gate electrode formed on a surface of said second insulating film, and wherein each of said at least two transistors is a multilayer gate type transistor, and wherein said drain has a diffused impurity of the same second conductivity type as said source wiring layer.

3. A semiconductor device according to claim 1, wherein said first gate electrode includes a first portion located closer to said source than said drain and a second portion located closer to said drain than said source, wherein an impurity concentration is greater in said first portion than in said second portion.

4. The semiconductor device according to claim 1, wherein said source is formed by double diffusion of the impurity of the second conductivity type.

5. The semiconductor device according to claim 1, wherein said drain has a shallower depth than said source.

6. The semiconductor device according to claim 1, wherein said drain has the impurity of the second conductivity type in said semiconductor substrate diffused to a third depth different from the first depth.

7. The semiconductor device according to claim 6, wherein the third depth is approximately equal to the second depth.

8. A semiconductor device comprising:
a semiconductor substrate of a first conductivity type;
at least two transistors each including,
    a source and a drain of a second conductivity type, formed on a surface of said semiconductor substrate in an electrically separated manner;
    a first insulating film formed on a surface of a channel region between said source and drain;
    a first gate electrode formed on a surface of said first insulating film;
    a second insulating film formed on a surface of said first gate electrode;
    a third insulating film formed on a surface of said drain;
    a source wiring layer connected to said source of each of said at least two transistors and having an impurity of a second conductivity type diffused in said semiconductor substrate;
a fourth insulating film formed on a surface of said source wiring layer; and
a fifth insulating film formed on a surface of said source of each of said at least two transistors, and having a thickness greater than a thickness of one of said third insulating film and said fourth insulating film.

9. The semiconductor device according to claim 8, wherein each of said at least two transistors further comprises a second gate electrode formed on a surface of said second insulating film, and wherein each of said at least two transistors is a multilayer gate type transistor, and wherein said drain has a diffused impurity of the same second conductivity type as said source wiring layer.

10. A semiconductor device according to claim 8, wherein said first gate electrode includes a first portion located closer to said source than said drain and a second portion located closer to said drain than said source, wherein an impurity concentration is greater in said first portion than in said second portion.

11. The semiconductor device according to claim 8, wherein said source is formed by double diffusion of the impurity of the second conductivity type.

12. The semiconductor device according to claim 8, wherein a thickness of said fifth insulating film is greater than a thickness of each of said third insulating film and said fourth insulating film.

13. A semiconductor device comprising:

a semiconductor substrate of a first conductivity type;

at least two transistors each including, a source having an impurity of a second conductivity type in said semiconductor substrate diffused to a first depth;

a drain of a second conductivity type, electrically separated from said source and formed on a surface of said semiconductor substrate;

a first insulating film formed on a surface of a channel region between said source and said drain;

a first gate electrode formed on a surface of said first insulating film;

a second insulating film formed on a surface of said first gate electrode; and a third insulating film formed on a surface of said drain;

a source wiring layer connected to said source of each of said at least two transistors and by having the impurity of the second conductivity type in said semiconductor substrate diffused to a second depth shallower than the first depth;

a fourth insulating film formed on a surface of said source wiring layer; and a fifth insulating film formed on a surface of said source of each of said at least two transistors, and having a thickness greater than a thickness of one of said third insulating film and said fourth insulating film.

\* \* \* \* \*